(12) United States Patent
Briar

(10) Patent No.: US 6,770,962 B2
(45) Date of Patent: Aug. 3, 2004

(54) DISPOSABLE MOLD RUNNER GATE FOR SUBSTRATE BASED ELECTRONIC PACKAGES

(75) Inventor: John Briar, Singapore (SG)

(73) Assignee: St Assembly Test Services Ltd. (SG)

( * ) Notice: Subject to any disclaimer, the term of this patent is extended or adjusted under 35 U.S.C. 154(b) by 0 days.

(21) Appl. No.: 10/043,605

(22) Filed: Jan. 14, 2002

(65) Prior Publication Data

US 2002/0056893 A1 May 16, 2002

Related U.S. Application Data

(62) Division of application No. 09/080,106, filed on May 18, 1998.

(51) Int. Cl.[7] .................. H01L 23/48; H01L 23/495
(52) U.S. Cl. ...................................... 257/690; 257/667
(58) Field of Search ................................ 257/690, 667

(56) References Cited

U.S. PATENT DOCUMENTS

| | | | |
|---|---|---|---|
| 4,954,308 A | | 9/1990 | Yabe et al. ............. 264/272.17 |
| 5,099,101 A | | 3/1992 | Millerick et al. ...... 219/121.82 |
| 5,311,402 A | | 5/1994 | Kobayashi et al. .......... 361/760 |
| 5,635,671 A | * | 6/1997 | Freyman et al. ........... 174/52.2 |
| 5,961,912 A | * | 10/1999 | Huang et al. .......... 264/272.15 |

* cited by examiner

Primary Examiner—Amir Zarabian
Assistant Examiner—Kiesha Rose
(74) Attorney, Agent, or Firm—MikioIshimaru

(57) ABSTRACT

A substrate and method of encapsulating a substrate based electronic package using injection molding and a two piece mold is described. The substrate has a barrier material formed on a gating region of the substrate. The barrier material can be formed directly over circuit wiring traces formed on the substrate thereby avoiding restrictions on the location of circuit wiring traces. The barrier material and encapsulant are chosen such that the adhesive force between the barrier material and the encapsulant is greater than the adhesive force between the barrier material and the substrate. When the mold runner is broken away the barrier material is also peeled away without damage to the substrate or circuit wiring traces.

8 Claims, 4 Drawing Sheets

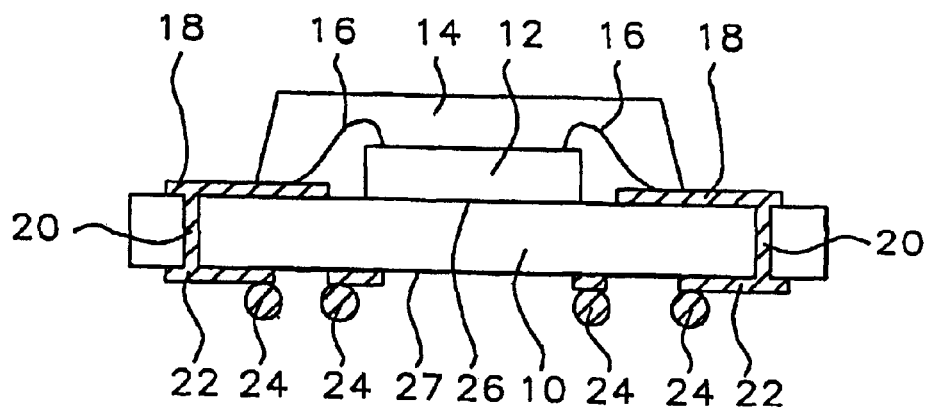
FIG. 1 - Prior Art
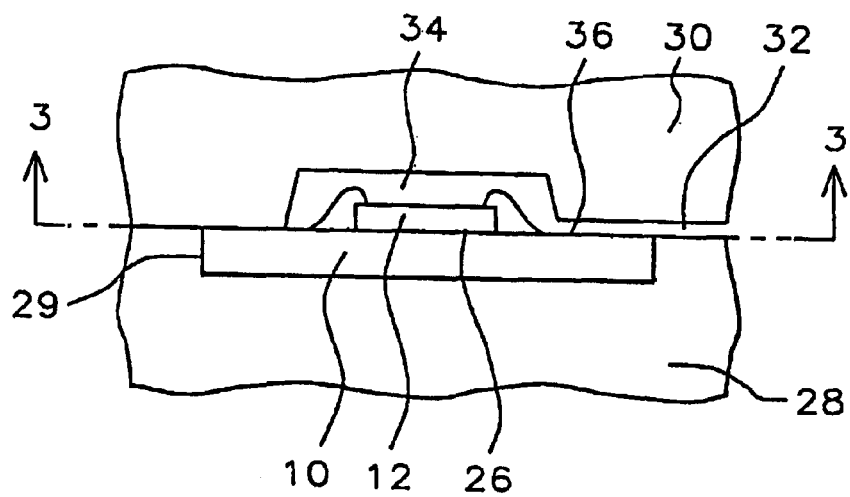
FIG. 2 - Prior Art
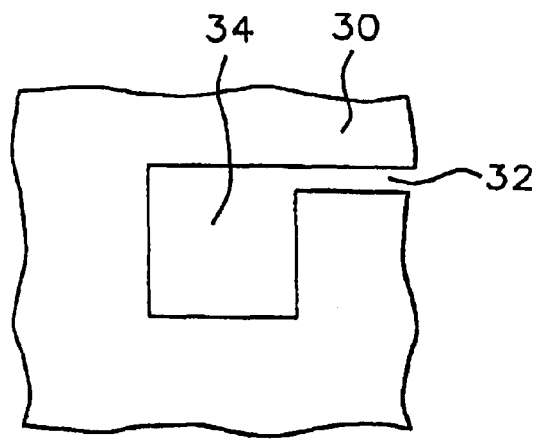
FIG. 3 - Prior Art

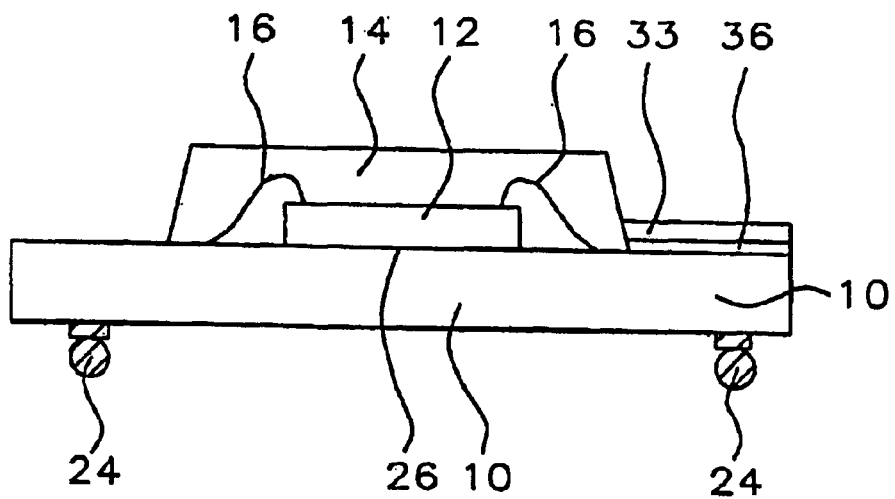
FIG. 4 – Prior Art
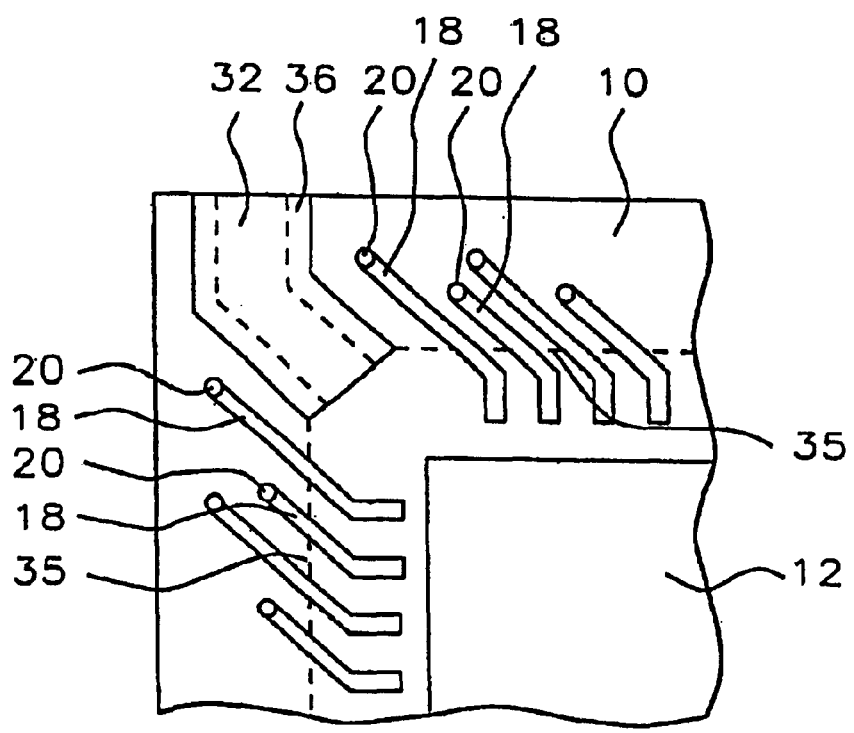
FIG. 5 – Prior Art

DISPOSABLE MOLD RUNNER GATE FOR SUBSTRATE BASED ELECTRONIC PACKAGES

This is a division of patent application Ser. No. 09/080,106, filing date May 18, 1998, A Disposable Mold Runner Gate For Substrate Based Electronic Packages, assigned to the same assignee as the present invention.

BACKGROUND OF THE INVENTION (1) Field of the Invention

This invention relates to encapsulation of substrate based electronic packages using injection molding with a two piece mold and more particularly to the use of a barrier material formed over the gating area of the substrate which is later peeled away and discarded.

(2) Description of the Related Art

Injection molding using a two piece mold is often used for encapsulation of electronic devices. This requires the formation of a gating area on the substrate surface for removal of the mold runner after the encapsulation is complete and the encapsulant is cured. The gating area usually has a metal formed on the substrate such as palladium or gold. This places severe restrictions on the routing of circuit traces formed on the surface of the substrate.

U.S. Pat. No. 5,635,671 to Freyman et al. describes a degating region having a material formed thereon chosen such that the material in the degating region forms a weak bond with the encapsulant used. Freyman et al. describe the used of degating material such as gold so that wiring traces must be routed away from the degating region.

U.S. Pat. No. 5,311,402 to Kobayashi et al. describes an integrated circuit chip bonded to a circuit board with a cap for hermetically sealing the chip. The cap is bonded to the circuit board at the edges of an open end thereof and bonded to the underside or bottom of the chip.

U.S. Pat. No. 5,099,101 to Millerick et al. describes an automatic laser trimming apparatus for semiconductor integrated chip packages which performs deflashing and degating operations.

U.S. Pat. No. 4,954,308 to Yabe et al. describes a resin encapsulating method using upper and lower half molds.

SUMMARY OF THE INVENTION

Electronic circuit packages typically comprise a substrate with one or more integrated circuit elements attached. Molded packages are often used for the encapsulation of the integrated circuit element because they provide a reliable encapsulation at a reasonable cost. FIG. 1 shows a cross section view of such a package. The package has a substrate 10 with an integrated circuit element 12 attached to the first surface 26 of the substrate 10. Circuit traces 18 on the first surface 26 of the substrate communicate with circuit traces 22 on the second surface 27 of the substrate using via connections 20 through the substrate. Input/output balls 24 provide ball grid array type input/output connections for the package. The input/output balls can be a material such as solder, solder coated copper, or the like. The connections between the integrated circuit element 12 and the circuit traces 18 on the first surface 26 of the substrate 10 are provided by wire bonds 16.

The substrate based package is encapsulated with a molded encapsulant 14. In most cases the molded encapsulant 14 is a molded plastic. In packages of this type the molded encapsulant is usually formed using an injection molding process using a two piece mold. The two piece mold is preferred because of cost, but requires a gate region on the substrate as will be explained with reference to FIGS. 2–5.

A cross section of a part of a two piece mold is shown in FIG. 2. The mold has an upper part 30, a lower part 28, a cavity 34 in the upper part 30 of the mold and a recess 29 in the lower part 28 of the mold. The substrate 10 with the integrated circuit element 12 attached fits into the recess 29 of the lower part 28 of the mold. As can be seen in FIG. 2, the input/output balls have not been formed on the substrate at this point in the processing. A mold runner channel 32 is formed in the upper part of the mold 30 and forms a path for the uncured encapsulant to flow into the cavity 34 in the upper part 30 of the mold. FIG. 3 is a plan view of the upper part 30 of the mold, taken along line 3–3' of FIG. 2, showing the cavity 34 and the mold runner channel 32.

During the encapsulation process uncured encapsulant is forced to flow from a source, not shown, through the mold runner channel 32 into the cavity 34, thereby filling the cavity. When the encapsulant is cured, encapsulant in the mold runner channel is also cured forming a mold runner 33, as shown in FIG. 4. This mold runner 33 must be removed after the encapsulant has cured. To accomplish the removal of the mold runner 33 a degating region 36 is typically formed on the first surface 26 of the substrate 10 at the substrate location which will be directly under the mold runner channel 32, see FIGS. 2 and 4. The degating region is formed of a material chosen such that the adhesive force between the encapsulant and the degating region material is less than the adhesive force between the encapsulant and the substrate. The degating region material is usually a metal such as gold or palladium.

With degating regions formed in this manner the circuit traces 18 on the first surface of the substrate and vias 20 between the first surface and second surface of the substrate must be routed to avoid the degating region 36, as shown in FIG. 5. The dashed lines in FIG. 5 show the location of the mold runner channel 32 and the perimeter 35 of the cavity. Degating regions of this type consume valuable surface area on the first surface of the substrate which could be used for circuit traces of vias. In addition mold compound material normally will flash outside the degating region and can cause problems.

It is a principle objective of this invention to provide a method of encapsulation of substrate based electronic devices using a gating region on a substrate which can be formed directly over circuit tracing.

It is another principle objective of this invention to provide a substrate, for substrate based electronic devices, wherein the substrate uses a gating region on a substrate which can be formed directly over circuit tracing.

These objectives are achieved by attaching a barrier material to the region of the substrate where the mold runner channel will be located when the package is encapsulated. The barrier material can be attached directly over circuit traces or via holes. The barrier material is chosen such that the adhesive force between the barrier material and the adhesive is less than the adhesive force of the cured encapsulant to the barrier material. After the encapsulation has been completed and the encapsulant cured the mold runner is removed thereby also removing the barrier material.

BRIEF DESCRIPTION OF THE DRAWINGS

FIG. 1 shows a cross section view of an encapsulated substrate based electronic package.

FIG. 2 shows a cross section view of a two piece mold.

FIG. 3 shows a plan view of the upper part of the two piece mold of FIG. 2 along line 3—3' of FIG. 2.

FIG. 4 shows a cross section view of a prior art encapsulated substrate based electronic package showing a mold runner and gating area.

FIG. 5 shows a top view of a prior art substrate showing a gating area with circuit traces routed away from the gating area.

FIG. 7 is a section view of the encapsulated substrate of FIG. 8 taken along line 7—7' of FIG. 8.

DESCRIPTION OF THE PREFERRED EMBODIMENTS

Figure 6:
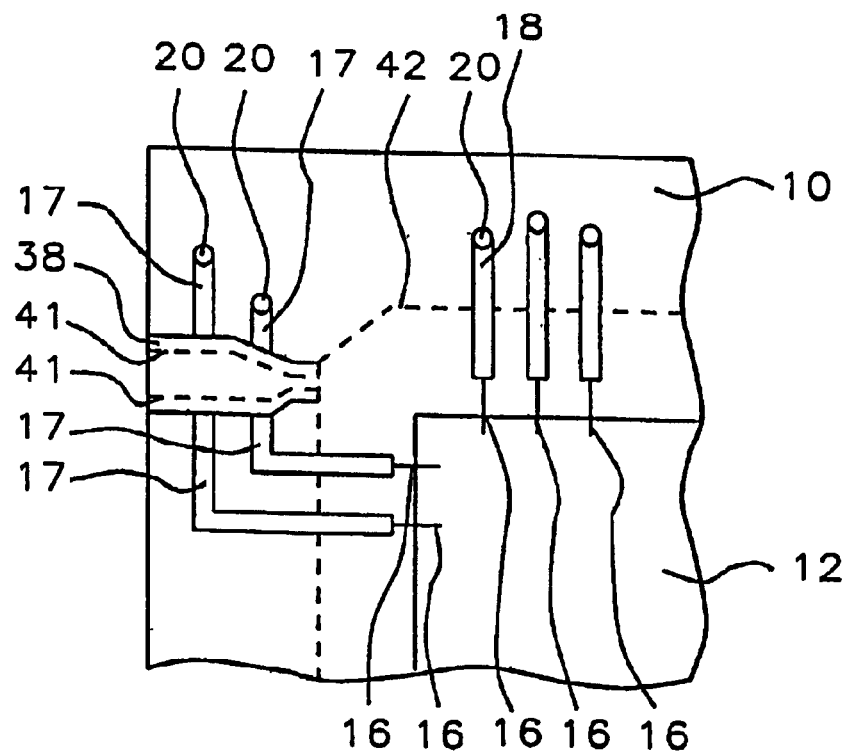
FIG. 6 shows a top view of a substrate of this invention showing a gating area with circuit traces routed in the gating area under the barrier material.

Refer now to FIGS. 1–3 and 6–10 for a description of the preferred embodiments of this invention. FIG. 1 shows a cross section view of a substrate based electronic package. The package has a substrate 10 having a first surface 26 and a second surface 27. The substrate can be a laminate with interior wiring, not shown, and can be ceramic or other material. An integrated circuit element 12 is attached to the first surface 26 of the substrate 10. In this example one integrated circuit element is shown, however a number of integrated circuit elements can be attached to the substrate. Circuit traces 18 on the first surface 26 of the substrate communicate with circuit traces 22 on the second surface 27 of the substrate using via connections 20 through the substrate. In this example wire bonds 16 provide electrical connection between the circuit traces 18 and the integrated circuit element 12.

In this example input/output balls 24 provide ball grid array type input/output connections for the package, however other types of input/output connections can be used. The input/output balls can be formed of conducting material such as copper, solder, solder coated copper, or the like. The package is encapsulated using a molded encapsulant 14 using a method which will now be explained.

FIG. 6 shows a top surface of a substrate which is to be used as part of the substrate based electronic circuit package. Circuit traces 17 and 18 and the tops of via connections 20 are shown on the surface of the substrate. A barrier material 38 is formed on the surface of the substrate covering the gating area or that part of the substrate which will be under the mold runner channel during the encapsulation step. The dotted lines 41 show the location which will be under the mold runner channel. The barrier material 38 is placed directly over some of the circuit traces 17. The barrier material 38 is a material such as polyimide tape, high temperature plastic, or similar material that is stable at high temperature and has a thickness of between about 0.025 and 0.080 millimeters. The barrier material and the encapsulant are chosen such that the adhesive force between the barrier material and the encapsulant is at least 15 times greater than the adhesive force between the barrier material and the substrate. An integrated circuit element 12 is attached to the surface of the substrate 10 and the integrated circuit element is connected to the circuit traces using wire bonds 16.

The substrate 10 with the integrated circuit element 12 attached to the first surface 26 of the substrate 10 is placed in the two piece mold, shown in FIGS. 2 and 3, for encapsulation. The substrate 10 is placed in the recess 29 formed in the lower part 28 of the mold. The upper part 30 of the mold has a cavity 34 which will mold the shape of the encapsulant. The location of the cavity on the first surface of the substrate is shown by a dashed line 42 in FIG. 6. The uncured encapsulant is injected into the cavity 34 of the upper part 30 of the mold through the mold runner channel 32, see FIGS. 2 and 3. The mold runner channel 32 is directly over the gating area 36 of the substrate which has the barrier material 38 formed thereon, see FIG. 6.

Figure 7:
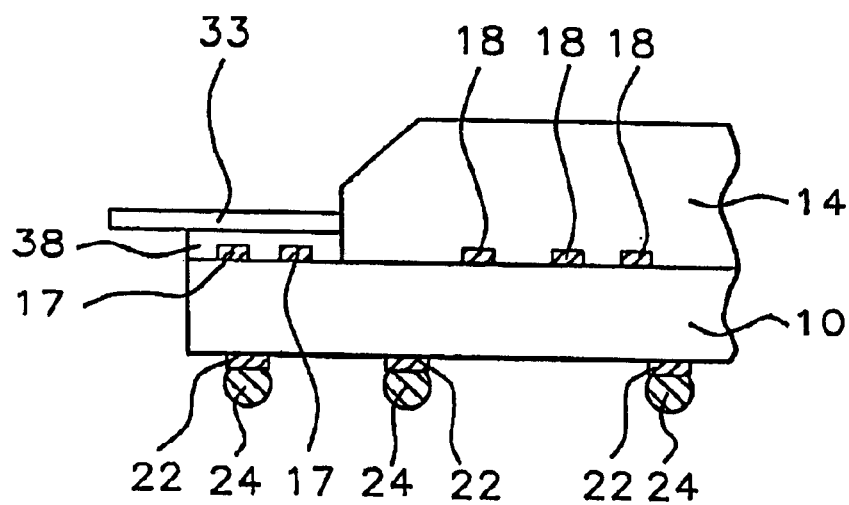
FIG. 7 shows a cross section view of a substrate of this invention after the encapsulant has been molded and cured showing barrier material formed in the gating area over the circuit traces and a mold runner over the barrier material.

Uncured encapsulant is then injected into the cavity 34 in the upper part 30 of the mold, leaving encapsulant in the mold runner channel 32 and cured. The encapsulant can be an encapsulating mold compound material and is cured by time and temperature. As previously indicated encapsulant and the barrier material are chosen such that the adhesive force between the barrier material and the encapsulant is at least 15 times greater than the adhesive force between the barrier material and the substrate. After curing the encapsulant the encapsulated package is removed from the mold. As shown in FIG. 7, the molded encapsulant 14 is formed on the substrate covering the integrated circuit element, not shown in FIG. 7, and leaving a mold runner 33 of encapsulant formed on the barrier material 38.

Figure 8:
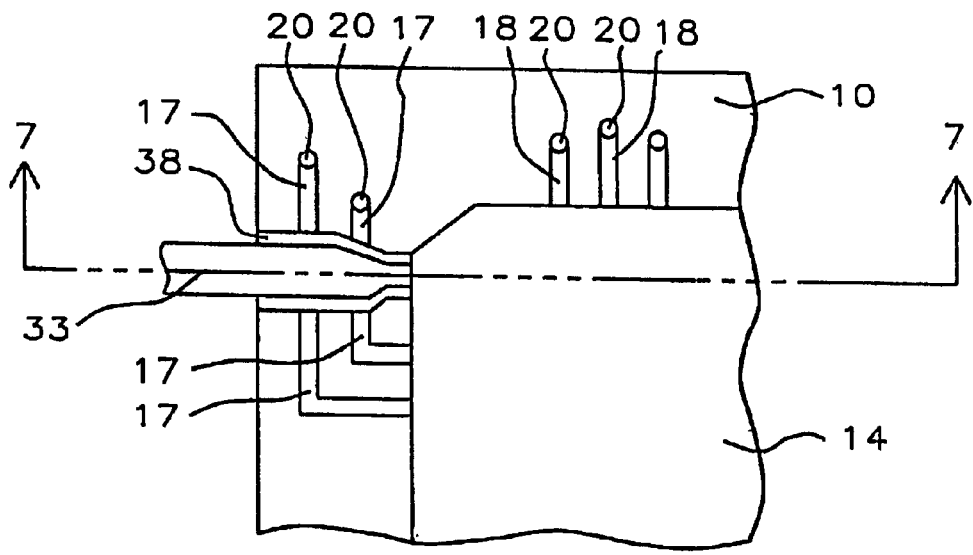
FIG. 8 shows a top view of the encapsulated substrate of FIG. 7 showing barrier material formed in the gating area over the circuit traces and a mold runner over the barrier material.

FIG. 8 shows the top view of the substrate at this point of the processing showing the molded encapsulant 14 and the mold runner 33 formed on the barrier material 38. As can be seen in FIGS. 7 and 8 circuit tracings 17 can be routed directly under the barrier material 38 and mold runner 33. FIG. 7 is a cross section view of FIG. 8 taken along line 7—7' of FIG. 8. Since the adhesive force between the barrier material and the encapsulant is greater than the adhesive force between the barrier material and the substrate the mold runner can be broken away from the molded encapsulant 14 thereby peeling away the barrier material as well, as shown in FIGS. 9 and 10.

Figure 9:
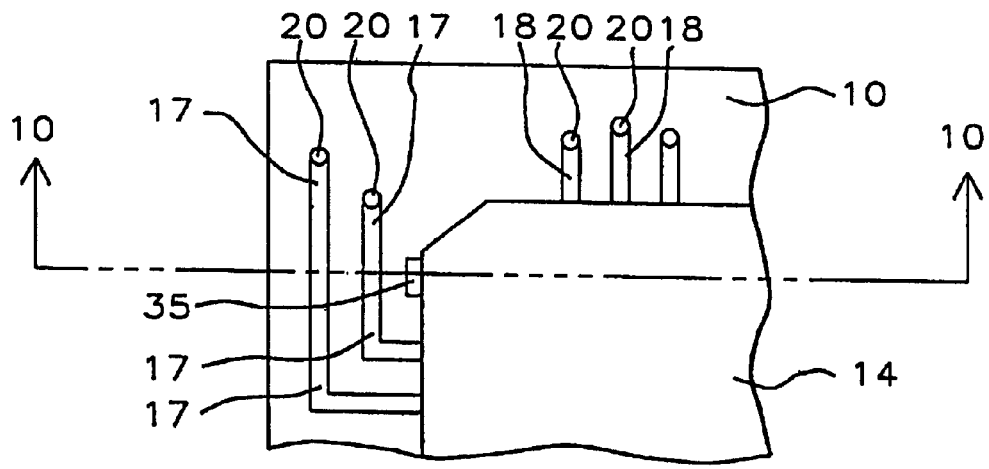
FIG. 9 shows a top view of the encapsulated substrate of this invention after the mold runner and barrier material have been removed.
Figure 10:
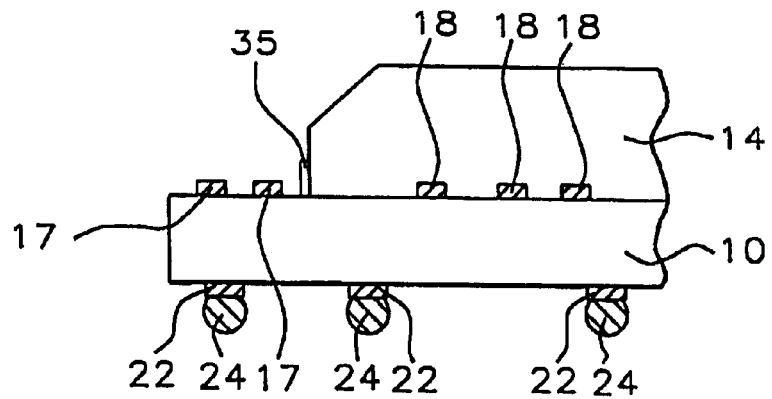
FIG. 10 shows a cross section view of the encapsulated substrate of FIG. 9 taken along line 19-10' of FIG. 9.

FIGS. 9 and 10 show the encapsulated package with the mold runner and barrier material removed, except for a small remainder 35 of the mold runner. FIG. 9 shows the top view of the substrate and FIG. 9 a cross section view taken along line 10-10' of FIG. 9.

The use of the barrier material of this invention makes it possible to form circuit traces in the gating area of the substrate since the circuit traces are protected by the barrier material. The use of the barrier material of this invention also allows the use of any existing substrate material or design that is available. Without the use of barrier material the location of the degating region on the substrate must match the design of the upper part of the mold. The use of the barrier material of this invention avoids the need for a fixed location for a degating region on a substrate for a particular upper mold design and allows the use of different substrate designs without the meed to redesign the upper part of the mold.

While the invention has been particularly shown and described with reference to the preferred embodiments thereof, it will be understood by those skilled in the art that various changes in form and details may be made without departing from the spirit and scope of the invention.

What is claimed is:

1. A molded package with a disposable mold runner gate, comprising:
- a substrate having a first surface and a second surface, wherein said first surface has a gating area;
- conductive traces formed on said first surface of said substrate wherein some of said conductive traces are formed in said gating area of said first surface of said substrate;
- a first number of electronic devices attached to said first surface of said substrate;
- electrical connections between said electronic devices and said conductive traces;
- input/output connections formed on said substrate;
- electrical connections between said conductive traces and said input/output connections;
- barrier material attached to said gating area of said substrate;
- encapsulation material formed over a part of said barrier material attached to said gating area of said substrate, thereby forming a mold runner, wherein said barrier material and said encapsulation material are chosen so that the adhesion of said barrier material to said substrate is less than the adhesion of said barrier material to said encapsulation material; and
- a cover of said encapsulation material formed over part of said substrate covering said first number of electronic devices.

2. The molded package with a disposable mold runner gate of claim 1 wherein said input/output connections comprise a ball grid array formed on said second surface of said substrate.

3. The molded package with a disposable mold runner gate of claim 1 wherein said electrical connections between said electronic devices and said conductive traces comprise wire bonds.

4. The molded package with a disposable mold runner gate of claim 1 wherein said first number of electronic devices is one electronic device.

5. The molded package with a disposable mold runner gate of claim 1 wherein said electronic devices are integrated circuit elements.

6. The molded package with a disposable mold runner gate of claim 1 wherein said barrier material is polyimide tape.

7. The molded package with a disposable mold runner gate of claim 1 wherein said barrier material is high temperature plastic.

8. The molded package with a disposable mold runner gate of claim 1 wherein said encapsulation material is an encapsulating mold compound.

* * * * *